United States Patent
Chien et al.

(10) Patent No.: US 9,263,277 B2
(45) Date of Patent: Feb. 16, 2016

(54) METAL GATE STRUCTURE OF A SEMICONDUCTOR DEVICE

(75) Inventors: Pei-Shan Chien, Keelung (TW); Andrew Joseph Kelly, Hengshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 13/599,868

(22) Filed: Aug. 30, 2012

(65) Prior Publication Data

US 2014/0061811 A1 Mar. 6, 2014

(51) Int. Cl.
| | |
|---|---|
| *H01L 27/11* | (2006.01) |
| *H01L 21/82* | (2006.01) |
| *H01L 21/28* | (2006.01) |
| *H01L 29/49* | (2006.01) |
| *H01L 29/66* | (2006.01) |
| *H01L 27/092* | (2006.01) |
| *H01L 21/8238* | (2006.01) |
| *H01L 29/51* | (2006.01) |

(52) U.S. Cl.
CPC .. *H01L 21/28088* (2013.01); *H01L 21/823842* (2013.01); *H01L 21/823878* (2013.01); *H01L 27/092* (2013.01); *H01L 29/4966* (2013.01); *H01L 29/66545* (2013.01); *H01L 29/517* (2013.01)

(58) Field of Classification Search
CPC .............. H01L 21/823807; H01L 21/823814; H01L 21/823842; H01L 27/092; H01L 27/11
USPC .................. 438/585, 592; 257/369, E27.067, 257/E21.19

See application file for complete search history.

(56) References Cited

U.S. PATENT DOCUMENTS

| 7,157,732 | B2 | 1/2007 | Krieger et al. | |
|---|---|---|---|---|
| 8,183,644 | B1 * | 5/2012 | Chuang et al. | 257/388 |
| 8,378,428 | B2 | 2/2013 | Chew et al. | |
| 2011/0121399 | A1 | 5/2011 | Park et al. | |
| 2011/0198699 | A1 * | 8/2011 | Hung et al. | 257/369 |
| 2013/0168744 | A1 * | 7/2013 | Hsu et al. | 257/288 |

FOREIGN PATENT DOCUMENTS

| KR | 20110056120 | 5/2011 |
|---|---|---|
| TW | 200617959 | 6/2006 |
| TW | 201214704 | 4/2012 |

\* cited by examiner

*Primary Examiner* — Monica D Harrison
(74) *Attorney, Agent, or Firm* — Slater & Matsil, L.L.P.

(57) ABSTRACT

The disclosure relates to integrated circuit fabrication, and more particularly to a metal gate structure. An exemplary structure for a semiconductor device comprises a substrate comprising an isolation region separating and surrounding both a P-active region and an N-active region; a P-work function metal layer in a P-gate structure over the P-active region, wherein the P-work function metal layer comprises a first bottom portion and first sidewalls, wherein the first bottom portion comprises a first layer of metallic compound with a first thickness; and an N-work function metal layer in an N-gate structure over the N-active region, wherein the N-work function metal layer comprises a second bottom portion and second sidewalls, wherein the second bottom portion comprises a second layer of the metallic compound with a second thickness less than the first thickness.

16 Claims, 15 Drawing Sheets

METAL GATE STRUCTURE OF A SEMICONDUCTOR DEVICE

TECHNICAL FIELD

The invention relates to integrated circuit fabrication, and more particularly to a semiconductor device with a metal gate structure.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for a reduced number of subsequent processes, including high temperature processing, that must be performed after formation of the gate.

However, there are challenges to implement such features and processes in complementary metal-oxide-semiconductor (CMOS) fabrication. For example, in a "gate last" fabrication process, multiple work-function layers in a metal gate structure cause high gate resistance, thereby increasing the likelihood of device instability and/or device failure. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DESCRIPTION

Figure 1:
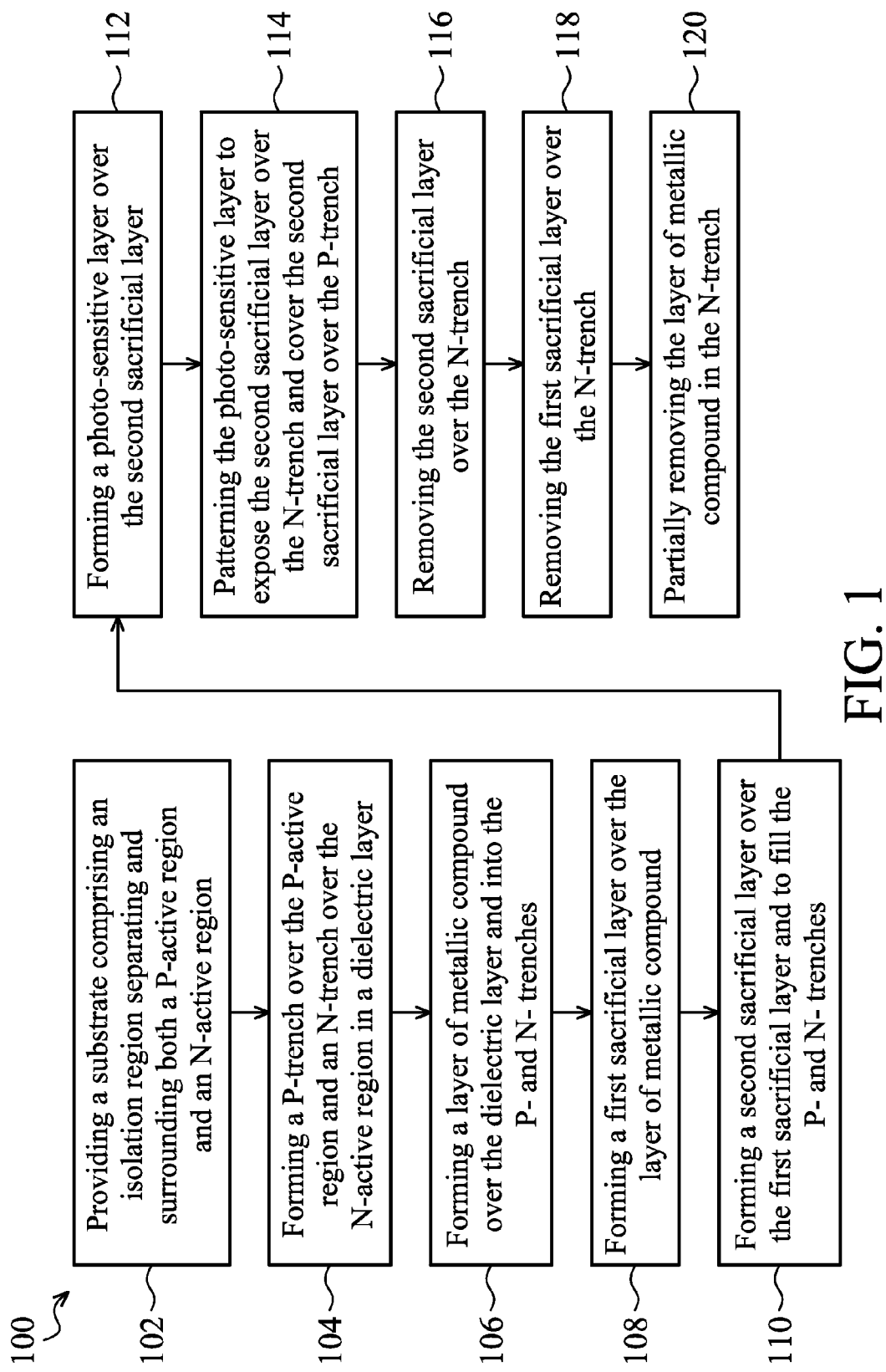
FIG. 1 is a flowchart illustrating a method of fabricating a semiconductor device comprising a metal gate structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Referring to FIG. 1, illustrated is a flowchart of a method 100 of fabricating a semiconductor device comprising a metal gate structure according to various aspects of the present disclosure. The method 100 begins with step 102 in which a substrate is provided, wherein the substrate comprises an isolation region separating and surrounding both a P-active region and an N-active region. The method 100 continues with step 104 in which a P-trench over the P-active region and an N-trench over the N-active region are formed in a dielectric layer. The method 100 continues with step 106 in which a layer of metallic compound is formed over the dielectric layer and into the P- and N-trenches. The method 100 continues with step 108 in which a first sacrificial layer is formed over the layer of metallic compound. The method 100 continues with step 110 in which a second sacrificial layer is formed over the first sacrificial layer and to fill the P- and N-trenches. The method 100 continues with step 112 in which a photo-sensitive layer is formed over the second sacrificial layer. The method 100 continues with step 114 in which the photo-sensitive layer is patterned to expose the second sacrificial layer over the N-trench and cover the second sacrificial layer over the P-trench. The method 100 continues with step 116 in which the second sacrificial layer over the N-trench is removed. The method 100 continues with step 118 in which the first sacrificial layer over the N-trench is removed. The method 100 continues with step 120 in which the layer of metallic compound in the N-trench is partially removed. The discussion that follows illustrates embodiments of a semiconductor device that can be fabricated according to the method 100 of FIG. 1.

Figure 2:
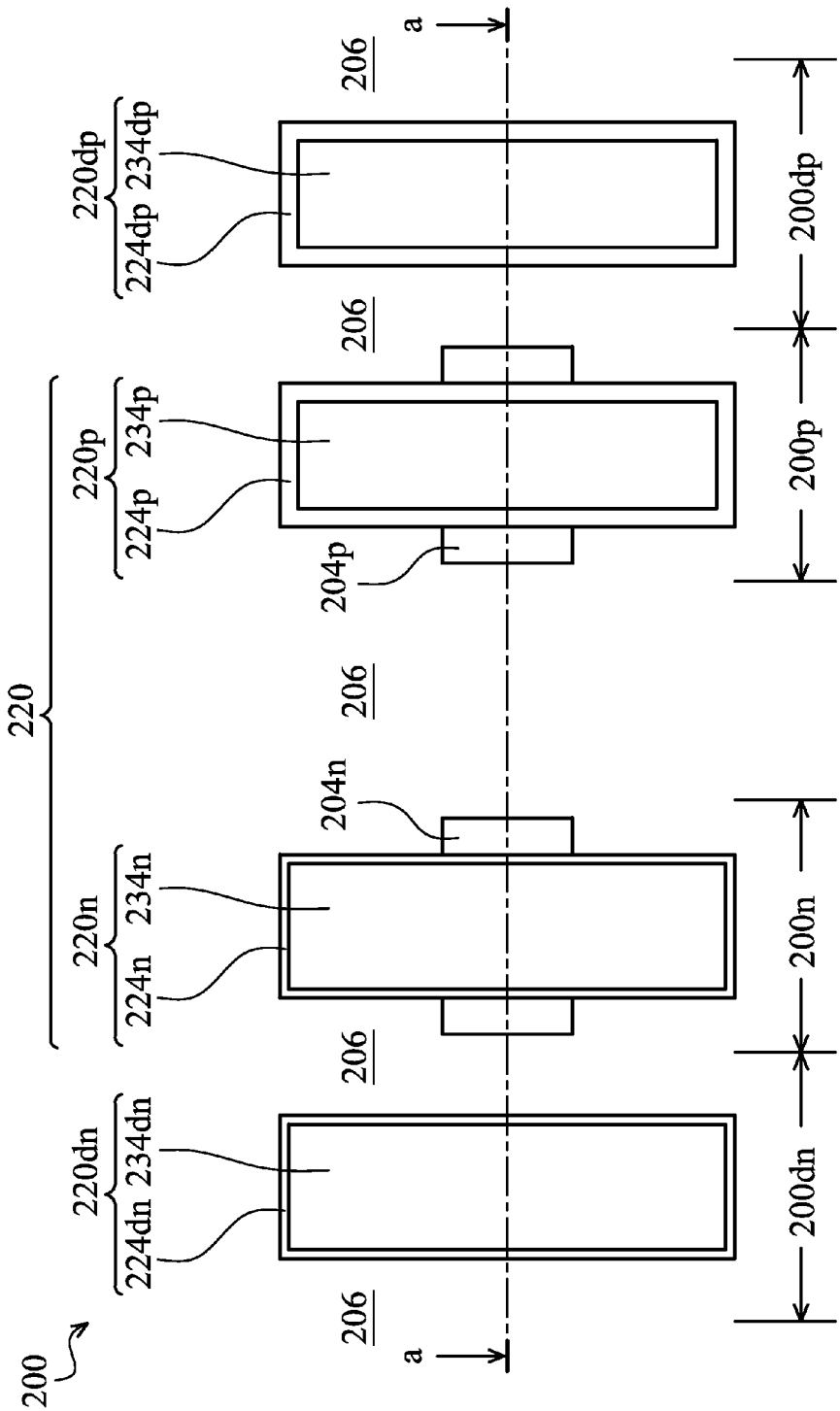
FIG. 2 is a top view of a semiconductor device comprising a metal gate structure according to various aspects of the present disclosure.

FIG. 2 is a top view of a semiconductor device 200 comprising a metal gate structure 220 according to various aspects of the present disclosure; and FIGS. 3-15 are cross-section views of a semiconductor device 200 comprising a metal gate structure 220 taken along the line a-a of FIG. 2 at various stages of fabrication according to various aspects of the present disclosure. It is noted that part of the semiconductor device 200 may be fabricated with complementary metal-oxide-semiconductor (CMOS) technology processing. Accordingly, it is understood that additional processes may be provided before, during, and after the method 100 of FIG. 1, and that some other processes may only be briefly described herein. Also, FIGS. 2 through 15 are simplified for a better understanding of the concepts of the present disclosure. For example, although the figures illustrate a metal gate structure 220 for the semiconductor device 200, it is understood the semiconductor device 200 may be part of an integrated circuit (IC) that may comprise a number of other devices comprising resistors, capacitors, inductors, fuses, etc.

FIG. 2 is a top view of a semiconductor device 200 comprising a metal gate structure 220 fabricated by a "gate last" process. A substrate 202 (shown in FIG. 3) comprising an isolation region 206 separating and surrounding both a P-active region 204$p$ and an N-active region 204$n$ is provided. The semiconductor device 200 comprises a P-type metal oxide semiconductor field effect transistor (PMOSFET) 200$p$ and an N-type metal oxide semiconductor field effect transistor (NMOSFET) 200$n$.

Figure 15:
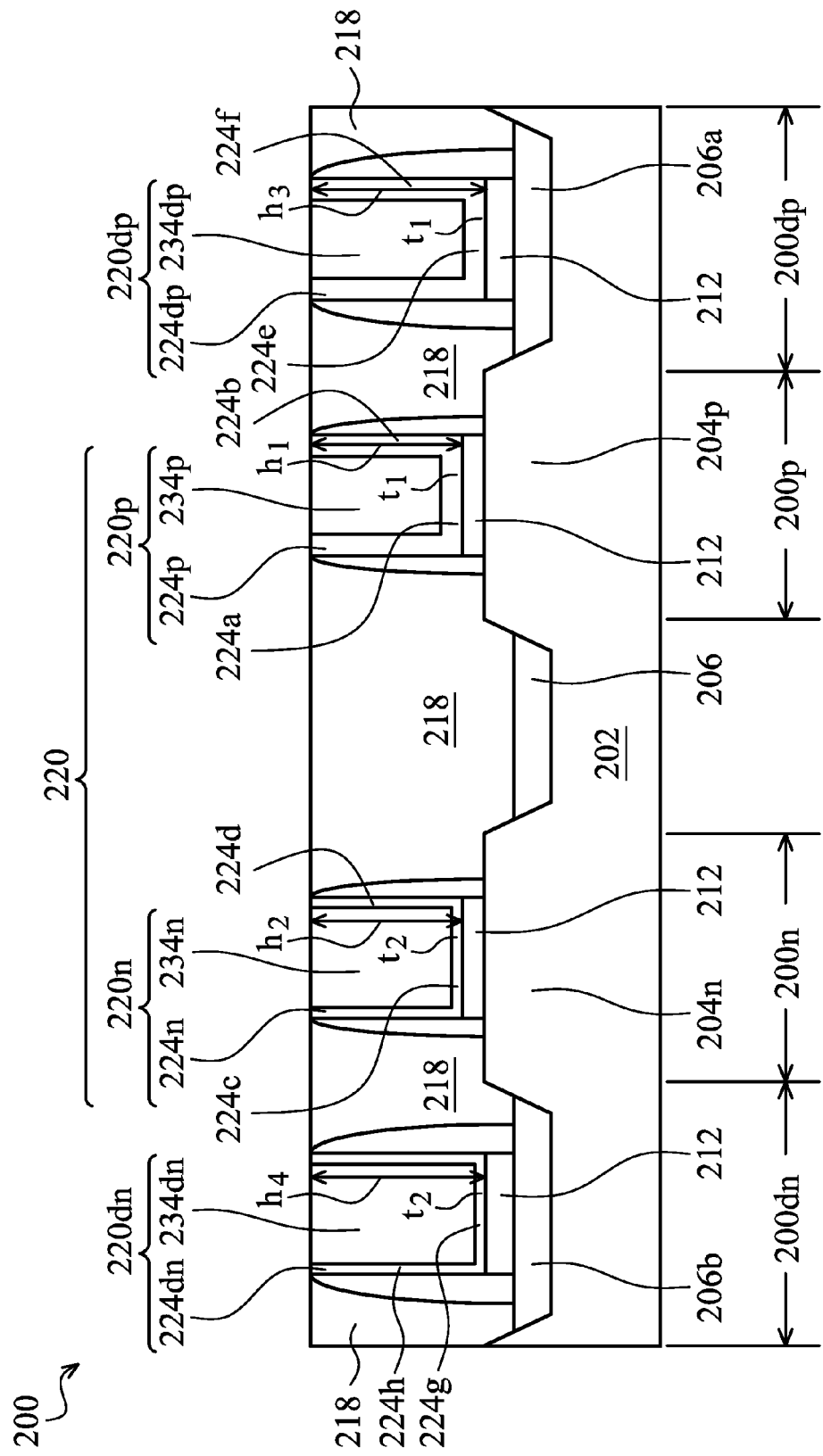

In some embodiments, the PMOSFET 200$p$ is formed from a P-gate structure 220$p$ comprising a P-work function metal layer 224$p$ over the P-active region 204$p$, wherein the P-work function metal layer 224p comprises a first bottom portion 224a and first sidewalls 224b, wherein the first bottom portion 224a comprises a first layer of metallic compound 224 with a first thickness $t_1$ (shown in FIG. 15).

In some embodiments, the NMOSFET 200n is formed from an N-gate structure 220n comprising an N-work function metal layer 224n over the N-active region 204n, wherein the N-work function metal layer 224n comprises a second bottom portion 224c and second sidewalls 224d, wherein the second bottom portion 224c comprises a second layer of the metallic compound 224 with a second thickness $t_2$ less than the first thickness $t_1$ (shown in FIG. 15). In the depicted embodiment, the P-gate structure 220p and N-gate structure 220n are combined and hereinafter referred to as the metal gate structure 220.

In some embodiments, the semiconductor device 200 may further comprise a dummy P-work function metal layer 224dp over a first portion 206a of the isolation region 206, wherein the dummy P-work function metal layer 224dp comprises a third layer of the metallic compound 224, wherein the dummy P-work function metal layer 224dp comprises a third bottom portion 224e and third sidewalls 224f, wherein a first height $h_1$ of the first sidewalls 224b is less than a third height $h_3$ of the third sidewalls 224f (shown in FIG. 15).

In some embodiments, the semiconductor device 200 may further comprise a dummy N-work function metal layer 224dn over a second portion 206b of the isolation region 206, wherein the dummy N-work function metal layer 224dn comprises a fourth layer of the metallic compound 224, wherein the dummy N-work function metal layer 224dn comprises a fourth bottom portion 224g and fourth sidewalls 224h, wherein a second height $h_2$ of the second sidewalls 224d is less than a fourth height $h_4$ of the fourth sidewalls 224h (shown in FIG. 15).

Figure 3:
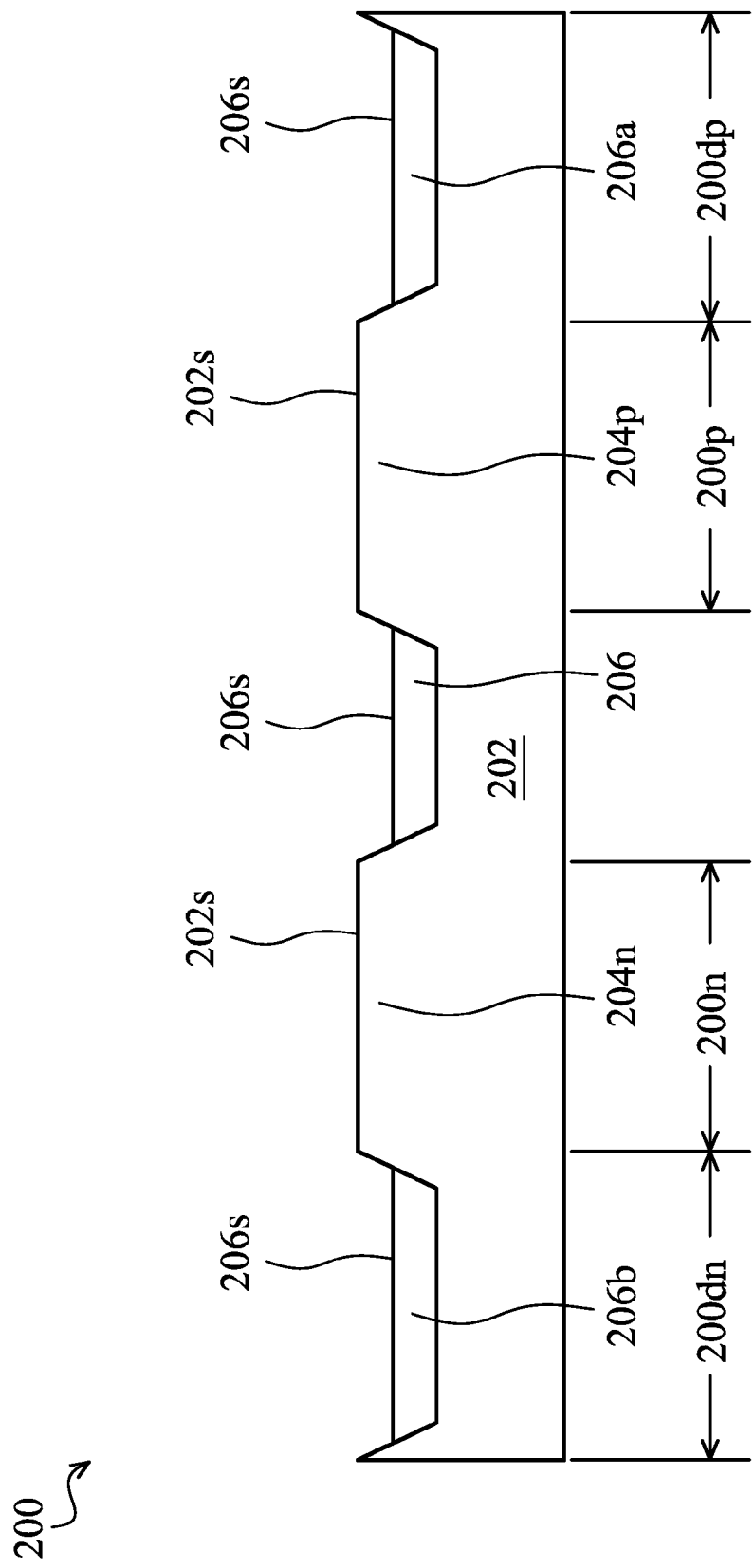
FIGS. 3-15 are cross-section views of a semiconductor device comprising a metal gate structure taken along the line a-a of FIG. 2 at various stages of fabrication according to various aspects of the present disclosure.

Referring to FIG. 3 and step 102, the method 100 begins at step 102 wherein a substrate 202 is provided. In at least one embodiment, the substrate 202 comprises a crystalline silicon substrate (e.g., wafer). In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In the depicted embodiment, the substrate 202 comprises the isolation region 206 separating and surrounding both the P-active region 204p for the PMOSFET 200p and N-active region 204n for the NMOSFET 200n. The active regions 204p, 204n may include various doping configurations depending on design requirements. For example, the P-active region 204p is doped with n-type dopants, such as phosphorus or arsenic; the N-active region 204n is doped with p-type dopants, such as boron or $BF_2$.

The isolation regions 206 may be formed on the substrate 202 to isolate the various active regions 204p, 204n from each other. The isolation regions 206 may utilize isolation technology, such as local oxidation of silicon (LOCOS) or shallow trench isolation (STI), to define and electrically isolate the various active regions 204p, 204n. In the present embodiment, the isolation region 206 comprises a STI. The isolation regions 206 may comprise materials such as silicon oxide, silicon nitride, silicon oxynitride, fluoride-doped silicate glass (FSG), a low-k dielectric material, and/or combinations thereof. The isolation regions 206, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide. In some embodiments, a chemical mechanical polishing (CMP) process and/or a cleaning process may be performed on the dielectric material, resulting in a surface 206s of the isolation region 206 lower than a surface 202s of the substrate 202.

Figure 4:
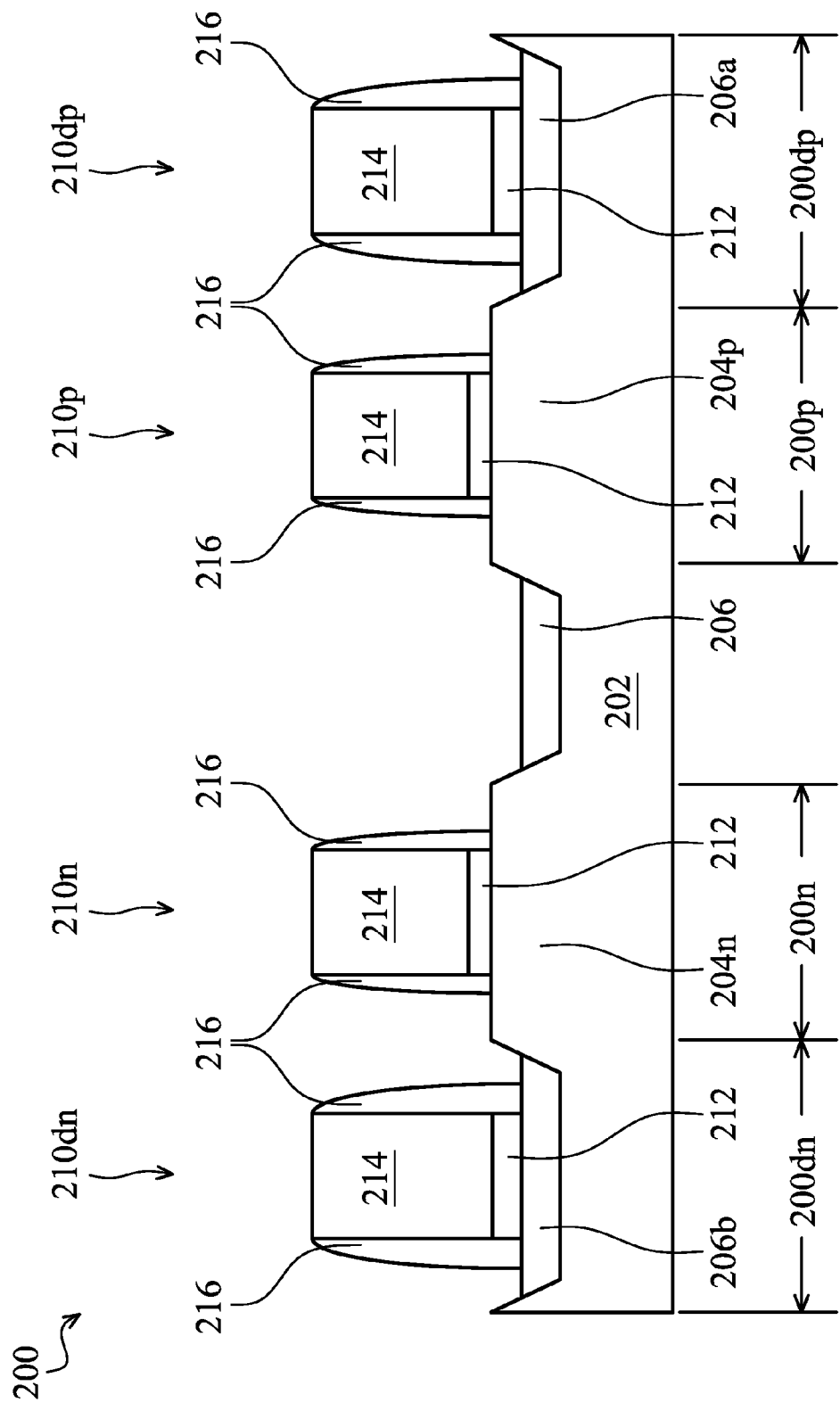

Referring to FIG. 4, a gate dielectric layer 212 is formed over the substrate 202. In some embodiments, the gate dielectric layer 212 may comprise silicon oxide, high-k dielectric material or combination thereof. A high-k dielectric material is defined as a dielectric material with a dielectric constant greater than that of $SiO_2$. The high-k dielectric layer comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer 212 may be grown by a thermal oxidation process, a chemical vapor deposition (CVD) process, an atomic layer deposition (ALD) process, and may have a thickness less than 2 nm.

The gate dielectric layer 212 may further comprise an interfacial layer (not shown) to minimize stress between the gate dielectric layer 212 and the substrate 202. The interfacial layer may be formed of silicon oxide or silicon oxynitride grown by a thermal oxidation process. For example, the interfacial layer can be grown by a rapid thermal oxidation (RTO) process or in a conventional annealing process comprising oxygen.

In one example of a "gate last" process, a dummy gate electrode layer 214 is subsequently formed over the gate dielectric layer 212. In some embodiments, the dummy gate electrode layer 214 may comprise a single layer or multilayer structure. In the present embodiment, the dummy gate electrode layer 214 may comprise poly-silicon. Further, the dummy gate electrode layer 214 may be doped poly-silicon with the uniform or gradient doping. The dummy gate electrode layer 214 may have a thickness in the range of about 30 nm to about 60 nm. The dummy electrode layer 214 may be formed using a low-pressure chemical vapor deposition (LPCVD) process.

Then, the dummy gate electrode 214 and gate dielectric layer 212 are patterned to produce the structure shown in FIG. 4. In the depicted embodiment, a layer of photoresist (not shown) is formed over the dummy gate electrode layer 214 by a suitable process, such as spin-on coating, and patterned to form a plurality of patterned photoresist features over the dummy gate electrode layer 214 by a proper lithography patterning method. The plurality of patterned photoresist features can then be transferred using a dry etching process to the underlying layers (i.e., the dummy gate electrode 214 and the gate dielectric layer 212) to form a plurality of the dummy gate structures 210p, 210dp, 210n, and 210dn. The photoresist layer may be stripped thereafter.

It is noted that the semiconductor device 200 may undergo other "gate last" processes and other CMOS technology processing to form various features of the semiconductor device 200. As such, the various features are only briefly discussed herein. The various components of the semiconductor device 200 may be formed prior to formation of the metal gate structure 220 in a "gate last" process. The various components may comprise p-type and n-type lightly doped source/drain (LDD) regions (not shown) and p-type and n-type source/drain (S/D) regions (not shown) in the active regions 204p, 204n and on opposite sides of the dummy gate structures 210p, 210n. The p-type LDD and S/D regions may be doped with B or In, and the n-type LDD and S/D regions may be doped with P or As.

A conformal spacer material is then deposited around the plurality of the dummy gate structures 210p, 210dp, 210n, and 210dn. In the present embodiment, the spacer material may include silicon nitride, silicon oxy-nitride, silicon carbide, or carbon-doped silicon nitride or other suitable material. The spacer material may comprise a single layer or multilayer structure. A blanket layer of the spacer material may be formed by CVD, ALD, physical vapor deposition (PVD), or other suitable technique. The blanket layer has a thickness ranging from about 5 to 15 nm. Then, an anisotropic etching is performed on the spacer material to form a pair of spacers 216 on sidewalls of each of the plurality of the dummy gate structures 210p, 210dp, 210n, and 210dn.

Then, an inter-layer dielectric (ILD) layer 218 may be formed over the spacers 216, isolation region 206, and the plurality of the dummy gate structures 210p, 210dp, 210n, and 210dn. The ILD layer 218 may include an oxide formed by a high-aspect-ratio process (HARP) and/or a high-density-plasma (HDP) deposition process. After the ILD layer 218 deposition, a CMP process is performed on the ILD layer 218 to expose the plurality of the dummy gate structures 210p, 210dp, 210n, and 210dn (shown in FIG. 5).

Figure 5:
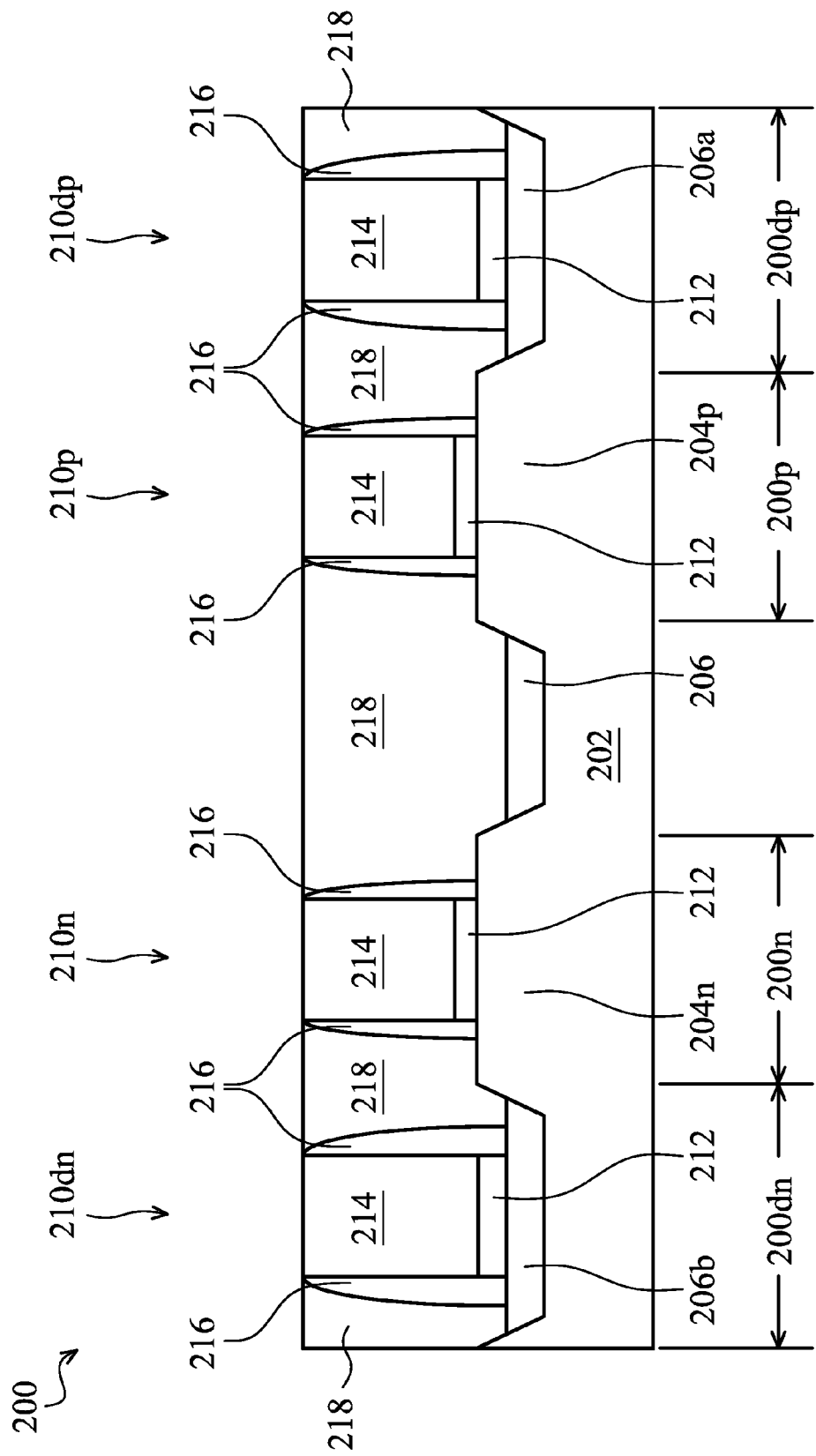
Figure 6:
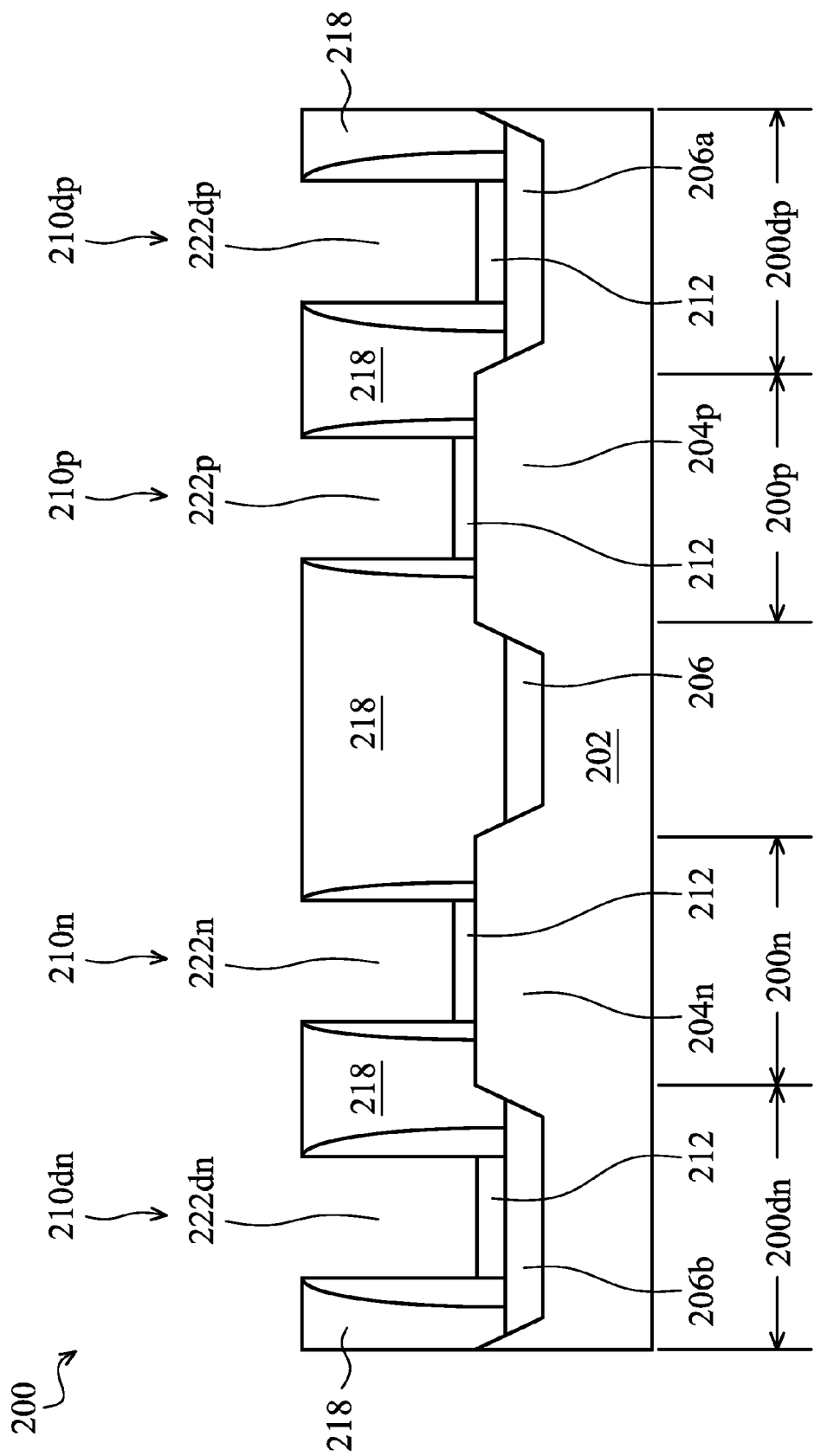

FIG. 6 shows the semiconductor device 200 of FIG. 5 after the dummy gate electrode layer 214 is removed from the plurality of the dummy gate structures 210p, 210n to form a P-trench 222p over the P-active region 204p and an N-trench 222n over the N-active region 204n in a dielectric layer 218 (i.e., the ILD layer 218), while the dummy gate electrode layer 214 is removed from the plurality of the dummy gate structures 210dp, 210dn to form a dummy P-trench 222dp over a first portion 206a of the isolation region 206 and a dummy N-trench 222dn over a second portion 206b of the isolation region 206 in the dielectric layer 218 (step 104 in FIG. 1).

In the depicted embodiment, the dummy gate electrode layer 214 may be removed using a wet etch and/or a dry etch process. In at least one embodiment, the wet etch process for dummy poly-silicon gate electrode layer 214 includes exposure to a hydroxide solution containing ammonium hydroxide, diluted HF, deionized water, and/or other suitable etchant solutions. In some embodiments, the dry etch process for dummy poly-silicon gate electrode layer 214 may be performed under a source power of about 650 to 800 W, a bias power of about 100 to 120 W, and a pressure of about 60 to 200 mTorr, using $Cl_2$, HBr and He as etching gases.

Conventionally, after formation of the P-trench 222p over the P-active region 204p and the N-trench 222n over the N-active region 204n in the dielectric layer 218, a P-work function metal layer fills in the P-trench 222p or portion thereof to form a P-gate structure over the P-active region 204p, while an N-work function metal layer fills in the N-trench 222n or portion thereof to form an N-gate structure over the N-active region 204n. In some embodiments, the filled trenches 222p, 222n may have a multi-layer structure such as a work function metal layer filled with a signal metal layer.

However, N/P patterning to form metal gate structures is challenging and complex. For example, since different work function metal layers are formed in the respective NMOSFET and PMOSFET, the processes require patterning a photoresist layer to protect regions of one type of device to form a metal gate in regions of the other type of device, and vice versa. Further, multiple work-function layers in a metal gate structure are generated as a result of reducing one patterning process. The multiple work-function layers cause high gate resistance, thereby increasing the likelihood of device instability and/or device failure.

Accordingly, the processing discussed below with reference to FIGS. 7-15 may form a layer of metallic compound with different thickness to make it easier to form different work function metal layers in the respective devices and improve device performance.

Figure 7:
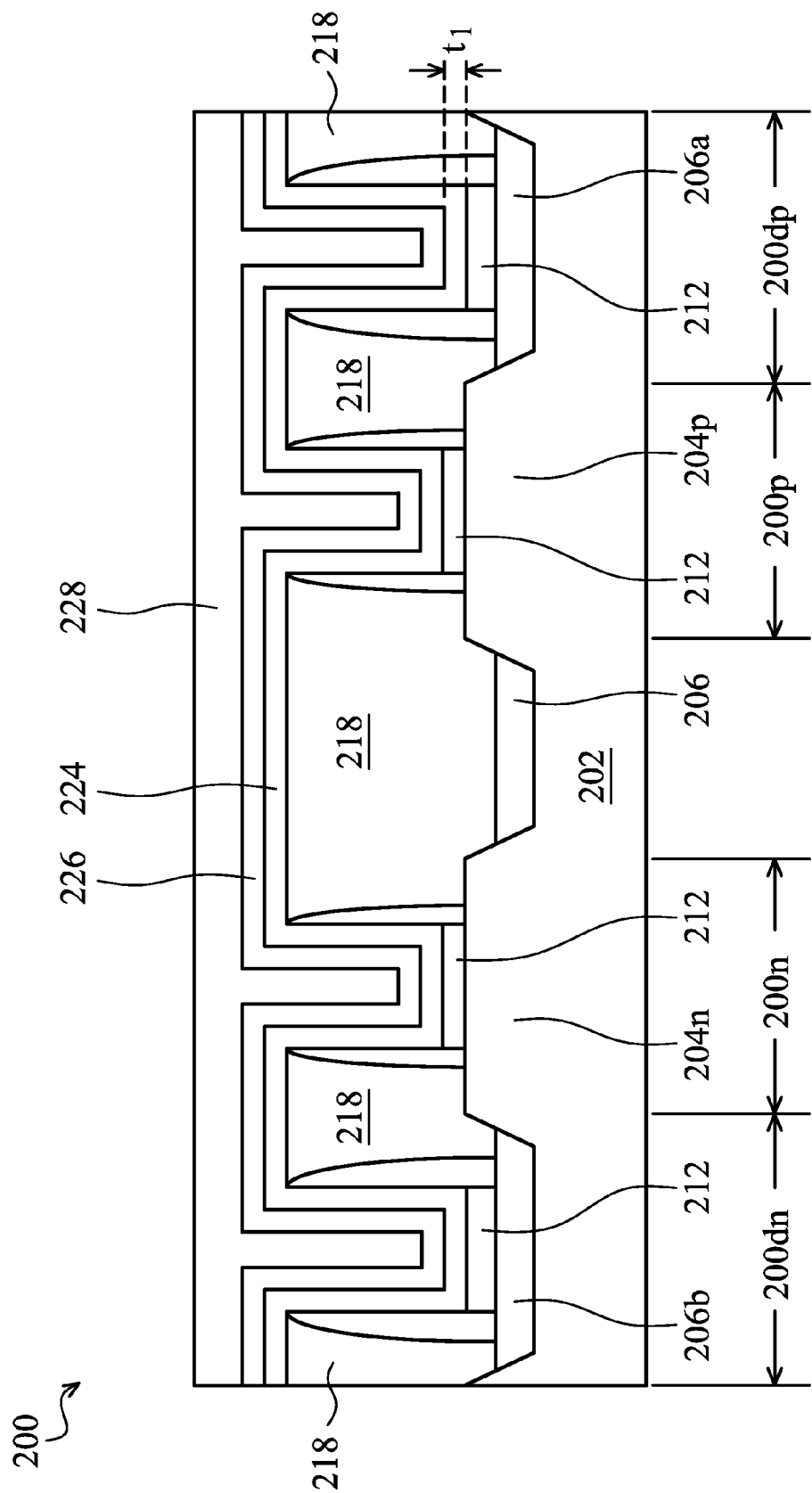

FIG. 7 shows the semiconductor device 200 of FIG. 6 after forming a layer of metallic compound 224 over the dielectric layer (i.e. the ILD layer 218) and into the P- and N-trenches 222p, 222n (step 106 in FIG. 1). For example, the layer of metallic compound 224 comprises TaN formed by CVD, PVD, ALD, or other suitable technique. In some embodiments, the layer of metallic compound 224 has a first thickness $t_1$ ranging from about 5 to 8 nm. Then, a first sacrificial layer 226 is formed over the layer of metallic compound 224 (step 108 in FIG. 1). For example, the first sacrificial layer 226 comprises TiN formed by CVD, PVD, ALD, or other suitable technique. In some embodiments, the first sacrificial layer 226 has a thickness ranging from about 5 to 15 nm.

Still referring to FIG. 7 and step 110 in FIG. 1, subsequent to the formation of the first sacrificial layer 226, the structure in FIG. 7 is produced by forming a second sacrificial layer 228 over the first sacrificial layer 226 and to fill the P- and N-trenches 222p, 222n. In the present embodiment, the second sacrificial layer 228 may comprise, but is not limited to, poly-silicon, photo-resist (PR) or Spin-on glass (SOG). The second sacrificial layer 228 may be formed by CVD, PVD, ALD, spin-on or other suitable technique. The thickness of the second sacrificial layer 228 will depend on remaining depths of the P- and N-trenches 222p, 222n after deposition of the first sacrificial layer 226. Accordingly, the second sacrificial layer 228 is deposited until the P- and N-trenches 222p, 222n are substantially filled. Then, a photo-sensitive layer 232 is formed over the second sacrificial layer 232 (step 112 in FIG. 1) by a suitable process, such as spin-on coating.

Figure 8:
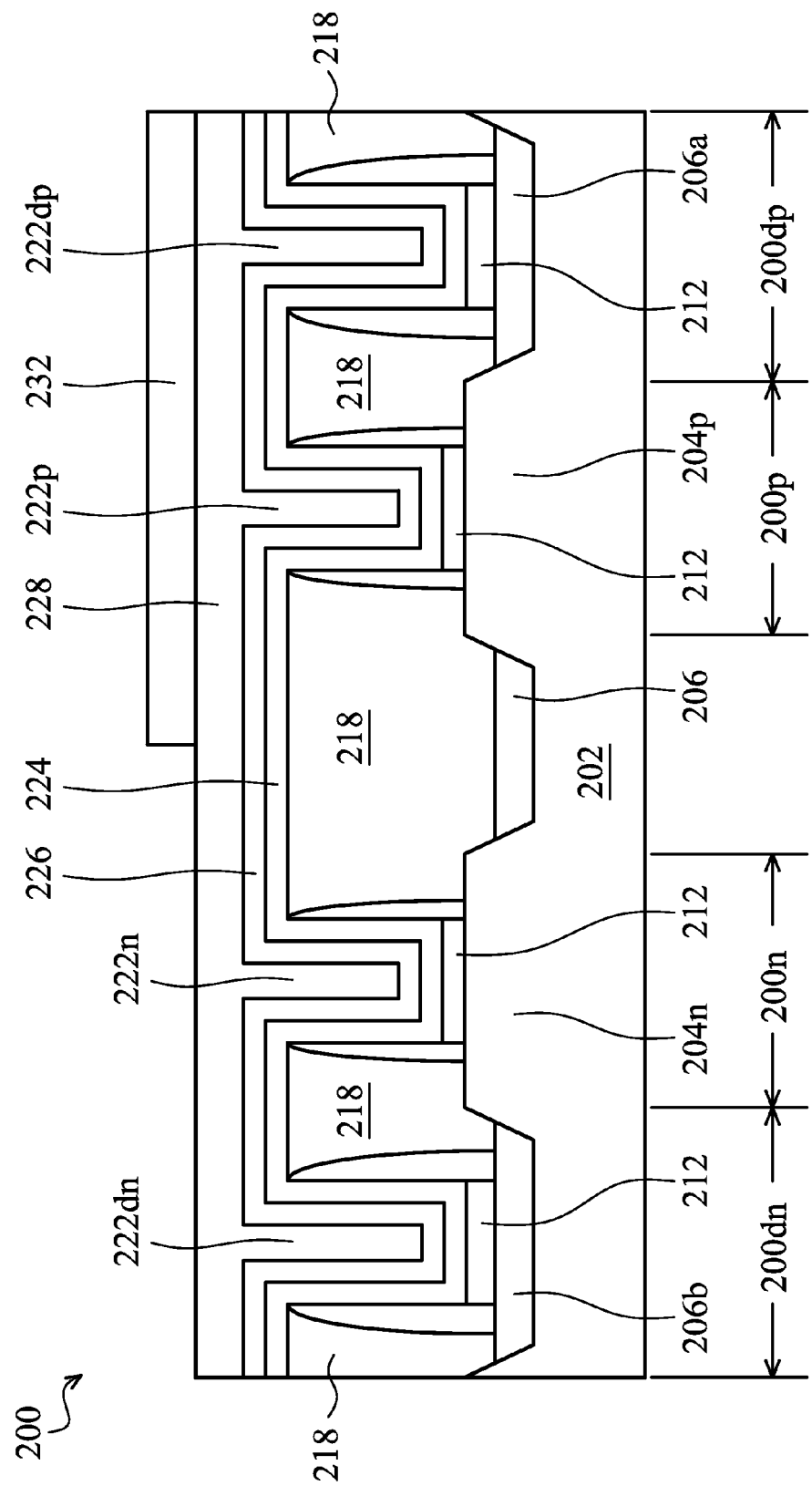

Referring to FIG. 8 and step 114 in FIG. 1, following the formation of the photo-sensitive layer 232, the structure in FIG. 8 is produced by patterning the photo-sensitive layer 232 by a proper lithography patterning method to expose the second sacrificial layer 228 over the N-trench 222n and cover the second sacrificial layer 228 over the P-trench 222p, while patterning the photo-sensitive layer 232 to expose the second sacrificial layer 228 over the dummy N-trench 222dn and cover the second sacrificial layer 228 over the dummy P-trench 222dp.

Figure 9:
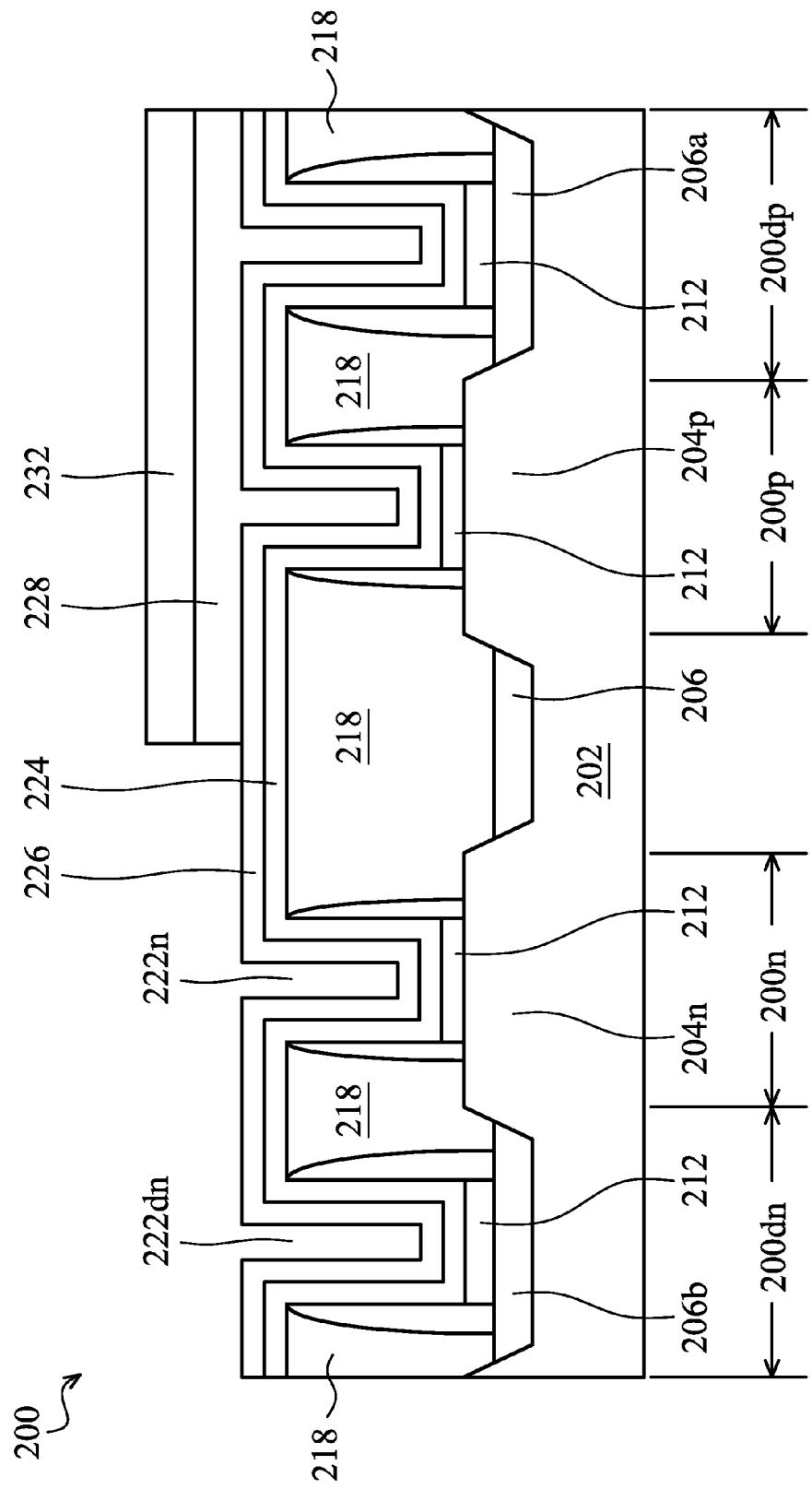

Referring to FIG. 9 and step 116 in FIG. 1, after patterning the photo-sensitive layer 232, the structure in FIG. 9 is produced by removing the second sacrificial layer 228 over the N-trench 222n and the dummy N-trench 222dn. In the depicted embodiment, using the patterned photoresist layer 232 as a mask, the second sacrificial layer 228 over the N-trench 222n and the dummy N-trench 222dn is removed by a dry etching process. In at least one embodiment, the dry etch process comprises removing the second sacrificial layer 228 comprising SOG in the N-trench 222n and the dummy N-trench 222dn may be performed at a temperature of about 15° C. to about 45° C., under a source power of about 500 W to about 1000 W and a bias power of about 10 W to about 40 W, and under a pressure of about 6 Torr to about 10 Torr, using reaction gases comprising HBr, $NF_3$, $CH_4$, and/or Ar. In some embodiments, using low etch selectivity (about 3 to about 20)

for SOG relative to TiN, the dry etching process may also define features of the first sacrificial layer 226 with rounded corners and tapered sidewalls (not shown).

Figure 10:
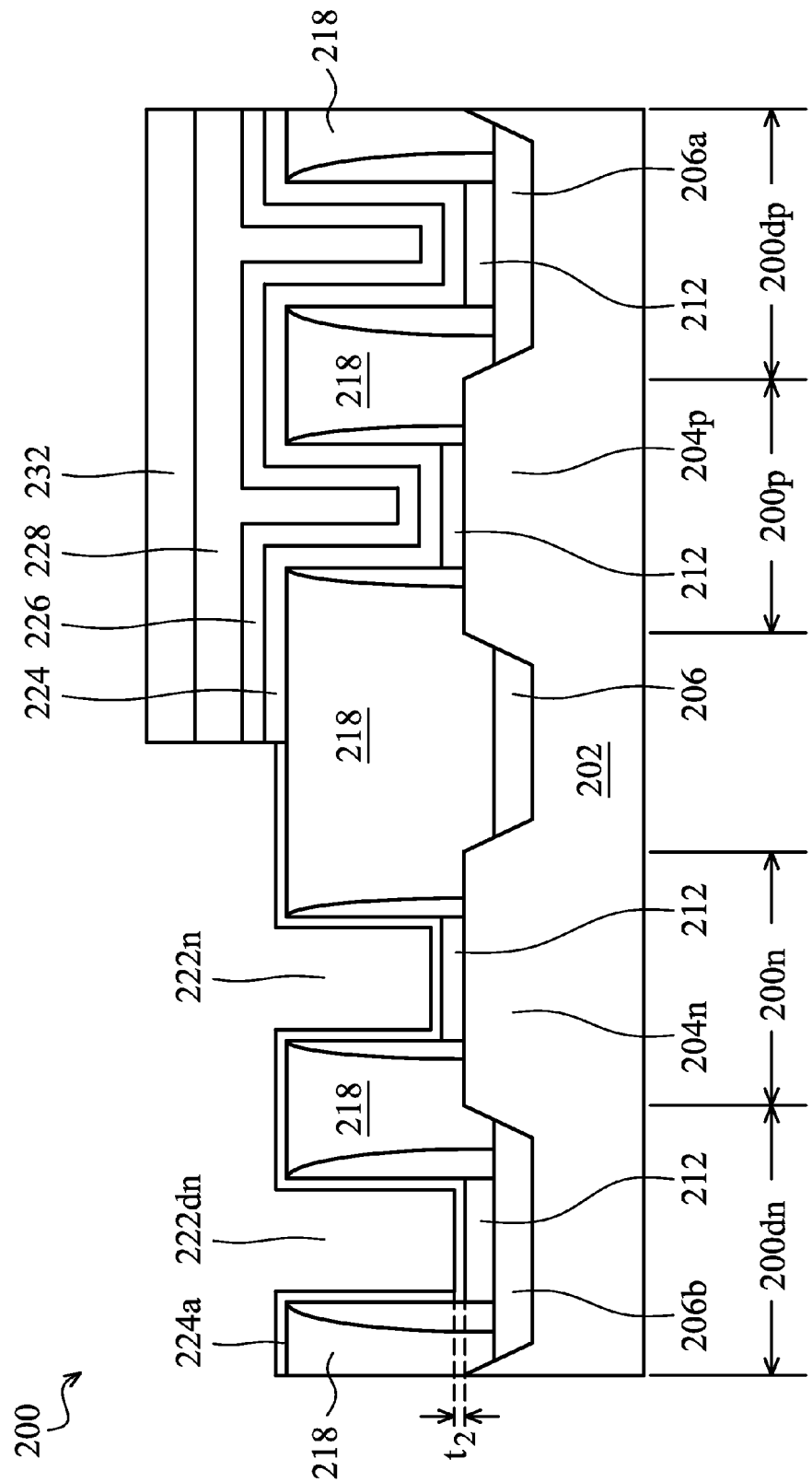
Figure 11:
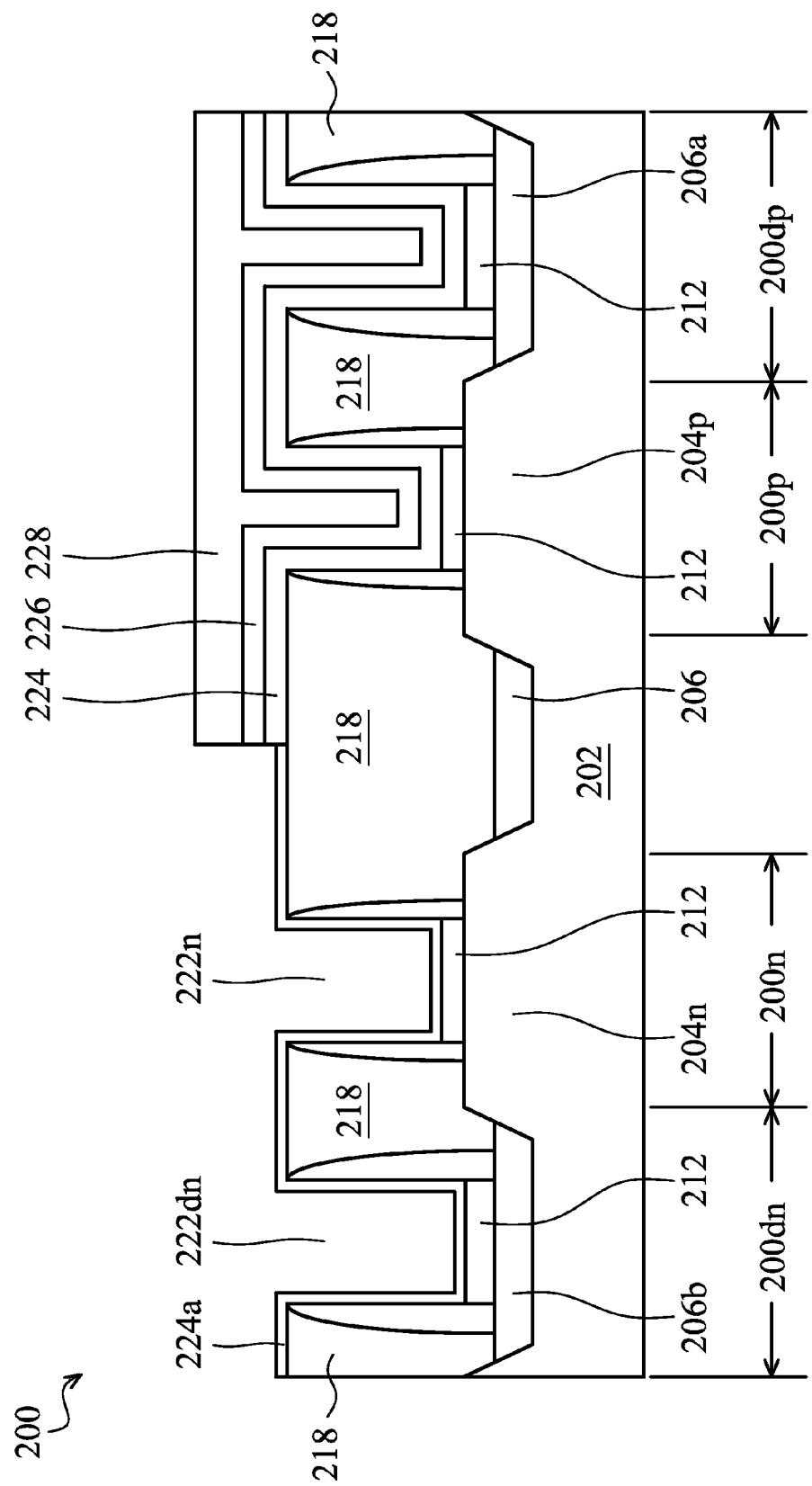

Referring to FIG. 10, subsequent to removal of the second sacrificial layer 228 over the N-trench 222n and the dummy N-trench 222dn, the structure in FIG. 10 is produced by removing the first sacrificial layer 226 over the N-trench 222n and the dummy N-trench 222dn (step 118 in FIG. 1), and partially removing the layer of metallic compound 224 in the N-trench 222n and the dummy N-trench 222dn (step 120 in FIG. 1). In the depicted embodiment, using the patterned photoresist layer 232 as a mask, the first sacrificial layer 228 over the N-trench 222n and the dummy N-trench 222dn is removed by a wet etching process, for example, by dipping the substrate 202 in a solution comprising $NH_4OH$, $H_2O_2$, and $H_2O$. In some embodiments, the solution of $NH_4OH$, $H_2O_2$, and $H_2O$ comprises a ratio of $NH_4OH$ to $H_2O_2$ between about 0.9 to about 1.1, and a ratio of $H_2O$ to $H_2O_2$ between about 3 to about 10.

In the depicted embodiment, the wet etching process with low etch selectivity for TiN relative to TaN further partially removes the layer of metallic compound 224 in the N-trench 222n and the dummy N-trench 222dn, for example, to form a remaining layer of metallic compound 224a. The remaining layer of metallic compound 224a has a second thickness $t_2$ ranging from about 1 to 3 nm. In some embodiments, the wet etching process may also define features of the remaining layer of metallic compound 224a with rounded corners and tapered sidewalls (not shown). The patterned photoresist layer 232 may be stripped thereafter (shown in FIG. 11).

Figure 12:
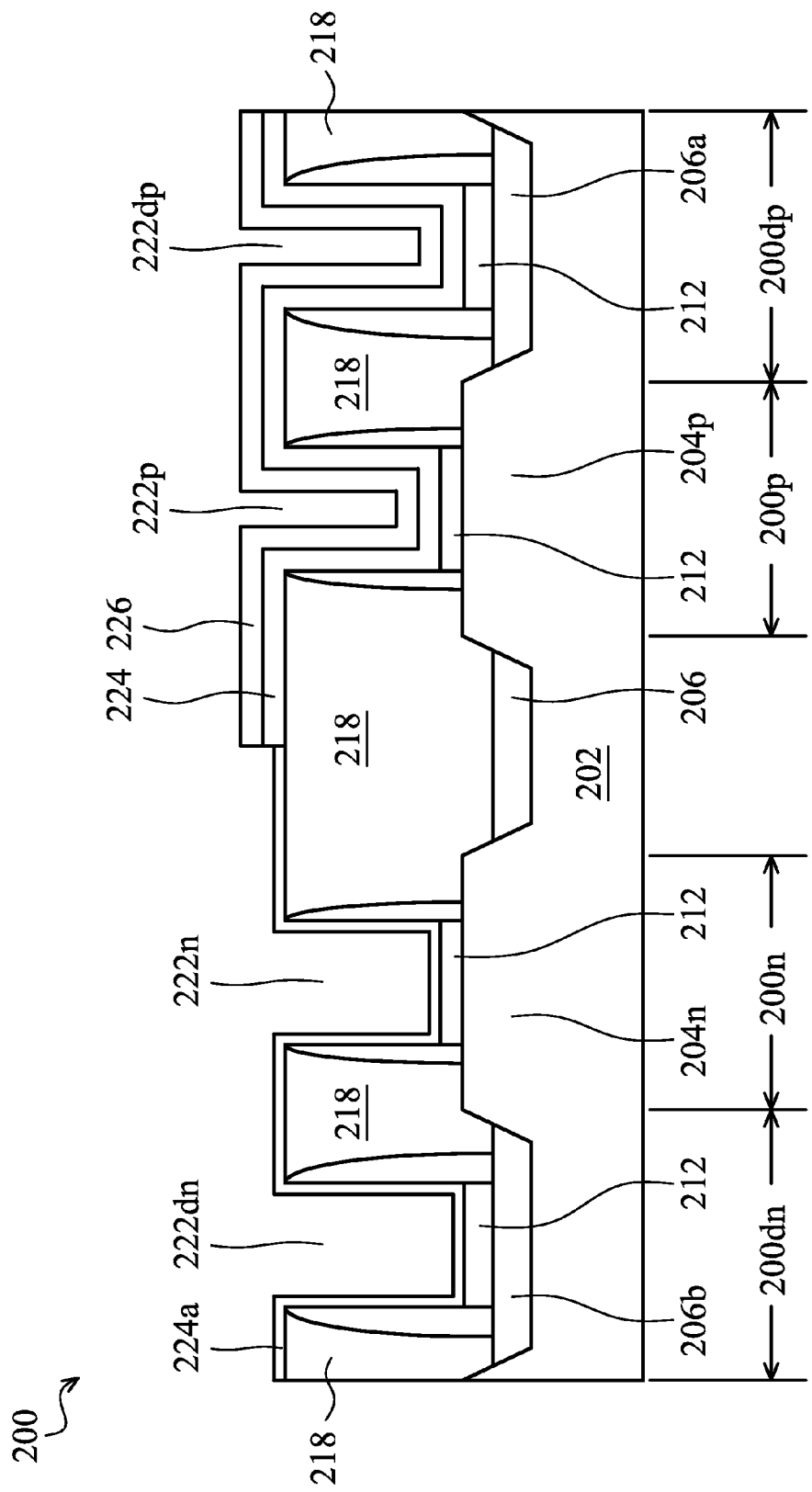

Referring to FIG. 12, after stripping the photo-sensitive layer 232, the structure in FIG. 12 is produced by removing the second sacrificial layer 228 over the P-trench 222p and the dummy P-trench 222dp. In the depicted embodiment, using the remaining layer of metallic compound 224a as a mask, the second sacrificial layer 228 over the P-trench 222p and the dummy P-trench 222dp is removed by a dry etching process. In at least one embodiment, the dry etch process comprises removing the second sacrificial layer 228 comprising SOG in the P-trench 222p and the dummy P-trench 222dp may be performed using $N_2$, $CF_4$, and $H_2$ as etching gases. In some embodiments, using high etch selectivity (about 25 to about 40) for SOG relative to TiN, the dry etching process may also maintain features of the first sacrificial layer 226.

Figure 13:
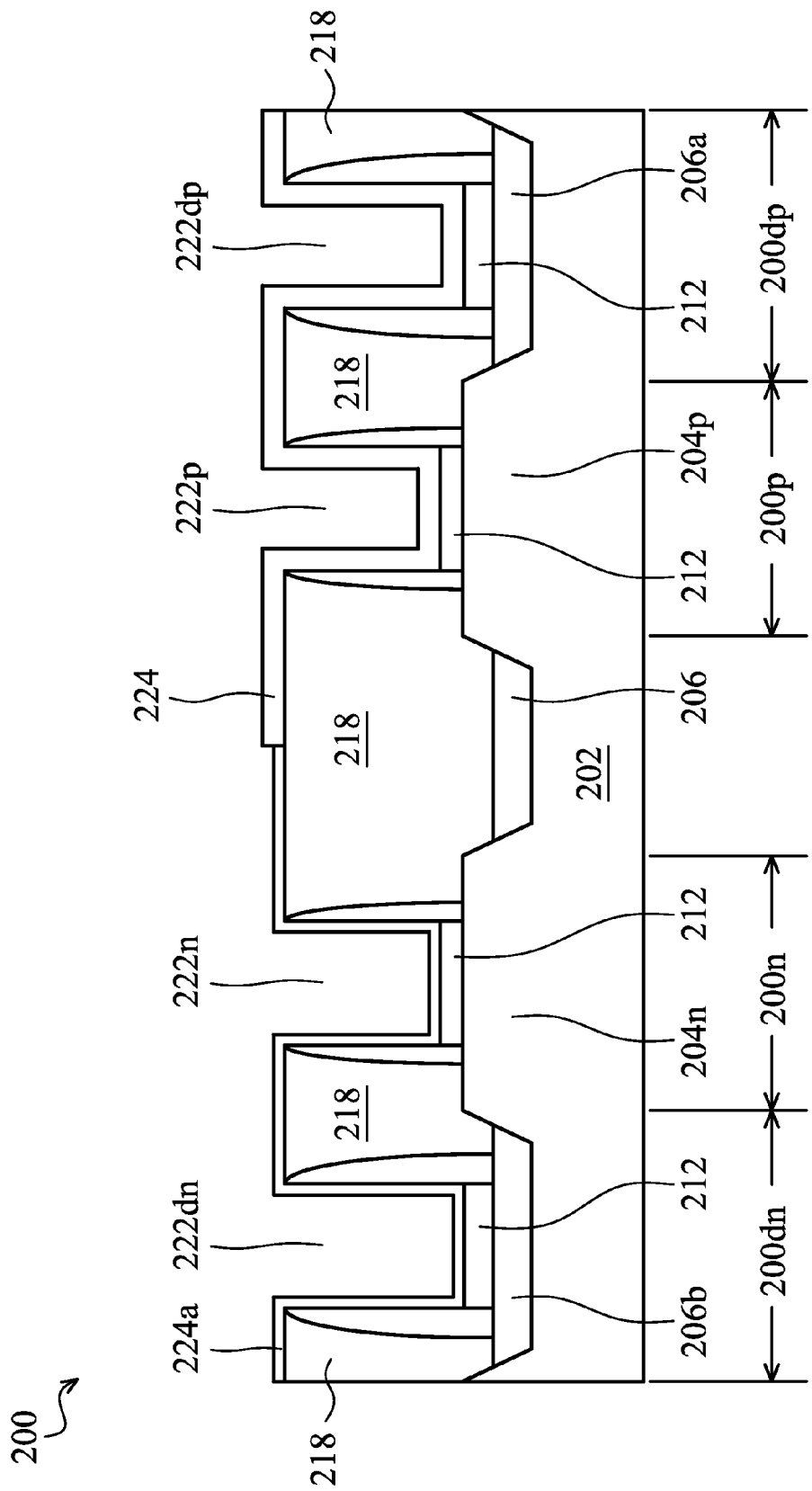

Referring to FIG. 13, subsequent to removal of the second sacrificial layer 228 over the P-trench 222p and the dummy P-trench 222dp, the structure in FIG. 13 is produced by removing the first sacrificial layer 226 over the P-trench 222p and the dummy P-trench 222dp. In the depicted embodiment, using the remaining layer of metallic compound 224a as a mask, the first sacrificial layer 226 over the P-trench 222p and the dummy P-trench 222dp is removed by a wet etching process, for example, by dipping the substrate 202 in a solution comprising $NH_4OH$, $H_2O_2$, and $H_2O$. In some embodiments, the solution of $NH_4OH$, $H_2O_2$, and $H_2O$ comprises a ratio of $NH_4OH$ to $H_2O_2$ between about 0.9 to about 1.1, and a ratio of $H_2O$ to $H_2O_2$ between about 45 to about 55. In the depicted embodiment, the wet etching process with high etch selectivity for TiN relative to TaN may maintain features of the layer of metallic compound 224.

Figure 14:
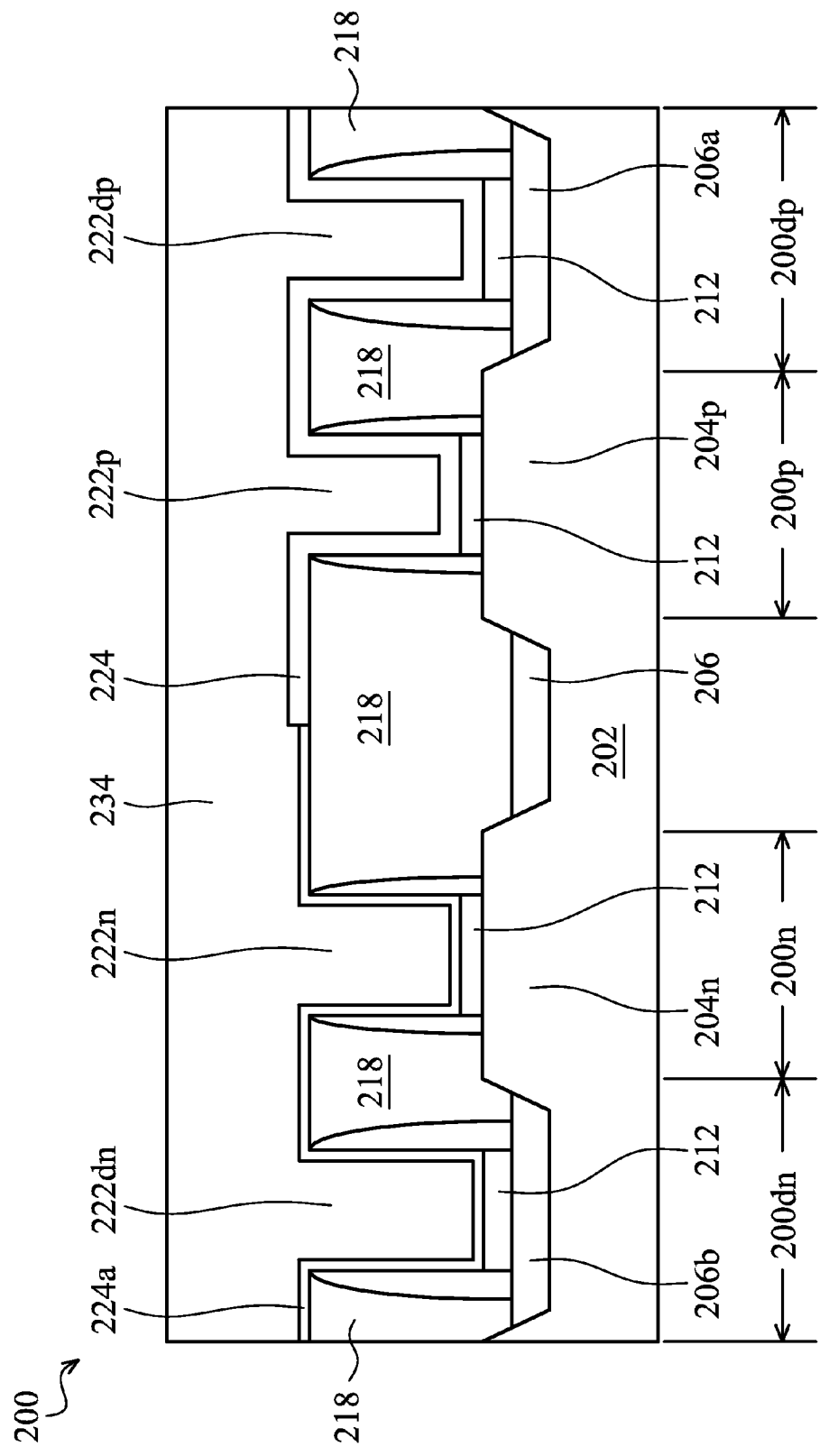

Referring to FIG. 14, after removal of the first sacrificial layer 226 over the P-trench 222p and the dummy P-trench 222dp, a signal metal layer 234 is deposited to fill the N-trench 222n, dummy N-trench 222dn, P-trench 222p, and the dummy P-trench 222dp. In the present embodiment, the signal metal layer 234 may comprise a material selected from a group of Al, Cu and W. The signal metal layer 234 may be formed by CVD, PVD, plating, spin-on, ALD, or other suitable technique. In some embodiment, the signal metal layer 234 may comprise a laminate. The laminate may further comprise a barrier metal layer, a liner metal layer or a wetting metal layer. Further, the thickness of the signal metal layer 234 will depend on the depth of the N-trench 222n, dummy N-trench 222dn, P-trench 222p, and the dummy P-trench 222dp. The signal metal layer 234 is thus deposited until the N-trench 222n, dummy N-trench 222dn, P-trench 222p, and the dummy P-trench 222dp are substantially filled or overfilled.

Referring to FIG. 15, another CMP is performed to planarize the signal metal layer 234 after filling the N-trench 222n, dummy N-trench 222dn, P-trench 222p, and the dummy P-trench 222dp. Since the CMP removes a portion of the signal metal layer 234, the layer of metallic compound 224, and the remaining layer of metallic compound 224a outside of the N-trench 222n, dummy N-trench 222dn, P-trench 222p, and the dummy P-trench 222dp, the CMP process may stop when reaching the ILD layer 218, thus providing a substantially planar surface.

In some embodiments, a remaining layer of metallic compound 224 in the P-trench 222p over the P-active region 204p is referred to as the P-work function metal layer 224p, wherein the P-work function metal layer 224p comprises a first bottom portion 224a and first sidewalls 224b, wherein the first bottom portion 224a comprises a first layer of metallic compound 224 with a first thickness $t_1$. In some embodiment, the P-work function metal layer 224p and signal metal layer 234p in the P-trench 222p over the P-active region 204p are combined and referred to as the P-gate structure 220p.

In some embodiments, a remaining layer of metallic compound 224 in the N-trench 222n over the N-active region 204n is referred to as the N-work function metal layer 224n, wherein the N-work function metal layer 224n comprises a second bottom portion 224c and second sidewalls 224d, wherein the second bottom portion 224c comprises a second layer of the metallic compound 224 with a second thickness $t_2$ less than the first thickness $t_1$. In some embodiment, a ratio of the first thickness $t_1$ to the second thickness $t_2$ is from about 2 to about 4. In some embodiments, the N-work function metal layer 224n and signal metal layer 234n in the N-trench 222n over the N-active region 204n are combined and referred to as an N-gate structure 220n. In some embodiments, the P-gate structure 220p and N-gate structure 220n are combined and referred to as the gate structure 220. Accordingly, Applicant's method of fabricating a semiconductor device 200 may fabricate a layer of metallic compound 224 with different thicknesses to make it easier to form different work function metal layers in the respective devices and improve device performance.

In some embodiments, a remaining layer of metallic compound 224 in the dummy P-trench 222dp over the first portion 206a of the isolation region 206 is referred to as the dummy P-work function metal layer 224dp, wherein the dummy P-work function metal layer 224dp comprises a third layer of the metallic compound 224, wherein the dummy P-work function metal layer 224dp comprises a third bottom portion 224e and third sidewalls 224f, wherein a first height $h_1$ of the first sidewalls 224b is less than a third height $h_3$ of the third sidewalls 224f, wherein a ratio of the first height $h_1$ to the third height $h_3$ is from about 0.5 to about 0.7, wherein the third bottom portion 224e substantially has the first thickness $t_1$. In some embodiment, the dummy P-work function metal layer 224dp and signal metal layer 234dp in the dummy P-trench 222dp are combined and referred to as a dummy P-gate structure 220dp.

In some embodiments, a remaining layer of metallic compound 224 in the dummy N-trench 222*dn* over the second portion 206*b* of the isolation region 206 is referred to as the dummy N-work function metal layer 224*dn*, wherein the dummy N-work function metal layer 224*dn* comprises a fourth layer of the metallic compound 224, wherein the dummy N-work function metal layer 224*dn* comprises a fourth bottom portion 224*g* and fourth sidewalls 224*h*, wherein a second height $h_2$ of the second sidewalls 224*d* is less than a fourth height $h_4$ of the fourth sidewalls 224*h*, wherein a ratio of the second height $h_2$ to the fourth height $h_4$ is from about 0.5 to about 0.7, wherein the fourth bottom portion 224*g* substantially has the second thickness $t_2$. In some embodiment, the dummy N-work function metal layer 224*dn* and signal metal layer 234*dn* in the dummy N-trench 222*dn* are combined and referred to as a dummy N-gate structure 220*dn*.

It is understood that the CMOS semiconductor device 200 may undergo further CMOS processes to form various features such as contacts/vias, interconnect metal layers, dielectric layers, passivation layers, etc.

In accordance with one embodiment, a semiconductor device comprises a substrate comprising an isolation region separating and surrounding both a P-active region and an N-active region; a P-work function metal layer in a P-gate structure over the P-active region, wherein the P-work function metal layer comprises a first bottom portion and first sidewalls, wherein the first bottom portion comprises a first layer of metallic compound with a first thickness; and an N-work function metal layer in an N-gate structure over the N-active region, wherein the N-work function metal layer comprises a second bottom portion and second sidewalls, wherein the second bottom portion comprises a second layer of the metallic compound with a second thickness less than the first thickness.

In accordance with another embodiment, a method of fabricating a semiconductor device comprises providing a substrate comprising an isolation region separating and surrounding both a P-active region and an N-active region; forming a P-trench over the P-active region and an N-trench over the N-active region in a dielectric layer; forming a layer of metallic compound over the dielectric layer and into the P- and N-trenches; forming a first sacrificial layer over the layer of metallic compound; forming a second sacrificial layer over the first sacrificial layer and to fill the P- and N-trenches; forming a photo-sensitive layer over the second sacrificial layer; patterning the photo-sensitive layer to expose the second sacrificial layer over the N-trench and cover the second sacrificial layer over the P-trench; removing the second sacrificial layer over the N-trench; removing the first sacrificial layer over the N-trench; and partially removing the layer of metallic compound in the N-trench.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
   a substrate comprising an isolation region separating and surrounding both a P-active region and an N-active region;
   a P-work function metal layer in a P-gate structure over the P-active region, wherein the P-work function metal layer comprises a first bottom portion and first sidewalls, wherein the first bottom portion comprises a first layer of metallic compound with a first thickness;
   an N-work function metal layer in an N-gate structure over the N-active region, wherein the N-work function metal layer comprises a second bottom portion and second sidewalls, wherein the second bottom portion comprises a second layer of the metallic compound with a second thickness less than the first thickness, and wherein a sidewall of the first sidewalls in closest proximity to the N-gate structure and a sidewall of the second sidewalls in closest proximity to the P-gate structure are laterally separated from each other; and
   a dummy work function metal layer over the isolation region, the dummy work function metal layer comprising a third bottom portion and third sidewalls, wherein a first height of the first sidewalls of the P-work function metal layer and a second height of the second sidewalls of the N-work function metal layer are less than a third height of the third sidewalls of the dummy work function metal layer.

2. The semiconductor device of claim 1, wherein a ratio of the first thickness to the second thickness is from about 2 to about 4.

3. The semiconductor device of claim 1, wherein the metallic compound comprises TaN.

4. The semiconductor device of claim 1, wherein the dummy work function metal comprises a dummy P-work function metal laterally separated from the P-work function metal layer.

5. The semiconductor device of claim 4, wherein the dummy P-work function metal layer comprises a third layer of the metallic compound.

6. The semiconductor device of claim 1, wherein a ratio of the first height to the third height is from about 0.5 to about 0.7.

7. The semiconductor device of claim 1, wherein the third bottom portion substantially has the first thickness.

8. The semiconductor device of claim 1, wherein the dummy work function metal comprises a dummy N-work function metal laterally separated from the N-work function metal layer.

9. The semiconductor device of claim 8, wherein the dummy N-work function metal layer comprises a fourth layer of the metallic compound.

10. A method of fabricating a semiconductor device comprising:
   providing a substrate comprising an isolation region separating and surrounding both a P-active region and an N-active region;
   forming a P-trench over the P-active region and an N-trench over the N-active region in a dielectric layer;
   forming a layer of metallic compound over the dielectric layer and into the P- and N-trenches;
   forming a first sacrificial layer over the layer of metallic compound;
   forming a second sacrificial layer over the first sacrificial layer and to fill the P- and N-trenches;
   forming a photo-sensitive layer over the second sacrificial layer;
   patterning the photo-sensitive layer to expose the second sacrificial layer over the N-trench and cover the second sacrificial layer over the P-trench;
   removing the second sacrificial layer over the N-trench; and
   removing the first sacrificial layer over the N-trench; and partially removing the layer of metallic compound in the N-trench.

11. The method of claim 10 further comprising:
removing the second sacrificial layer and first sacrificial layer over the P-trench.

12. The method of claim 10 further comprising:
forming a signal metal layer to fill the N-trench; and
performing a chemical mechanical polishing to planarize the signal metal layer.

13. The method of claim 10, wherein the step of forming a layer of metallic compound over the dielectric layer and into the P- and N- trenches layer is performed by CVD, PVD, or ALD.

14. The method of claim 10, wherein the step of removing the second sacrificial layer over the N-trench is performed using at least one of HBr, $NF_3$, $CH_4$, Ar, and combinations thereof, as etching gases.

15. The method of claim 10, wherein the step of removing the second sacrificial layer over the P-trench is performed using at least one of $N_2$, $CF_4$, $H_2$, and combinations, as etching gases.

16. The method of claim 10, wherein the step of removing the first sacrificial layer is performed in a solution comprising $NH_4OH$, $H_2O_2$, and $H_2O$.

* * * * *